United States Patent [19]
Paoli et al.

[11] Patent Number: 5,140,605
[45] Date of Patent: Aug. 18, 1992

[54] THERMALLY STABILIZED DIODE LASER STRUCTURE

[75] Inventors: Thomas L. Paoli, Los Altos, Calif.; Kenneth R. Ossman, Macedon; James J. Appel, Rochester, both of N.Y.

[73] Assignee: Xerox Corporation, Stamford, Conn.

[21] Appl. No.: 724,567

[22] Filed: Jun. 27, 1991

[51] Int. Cl.[5] .............................................. H01S 3/19
[52] U.S. Cl. ......................................... 372/50; 372/46
[58] Field of Search ..................... 372/46, 45, 50, 34

[56] References Cited

U.S. PATENT DOCUMENTS

| | | | |
|---|---|---|---|
| 4,831,629 | 5/1989 | Paoli et al. | 372/50 |
| 4,870,652 | 9/1989 | Thornton | 372/50 |
| 4,980,893 | 12/1990 | Thornton et al. | 372/50 |
| 4,987,468 | 1/1991 | Thornton | 372/46 |

FOREIGN PATENT DOCUMENTS

0251090  11/1986  Japan ..................................... 372/46

Primary Examiner—Georgia Y. Epps

[57] ABSTRACT

A diode laser structure is thermally stabilized by passing current through heater strips along the sides of the diode laser cavity. The thermally stabilized diode laser structure comprises a first confinement layer and a substrate of one conductivity type, an active layer, a second confinement layer and a contact layer of an opposing conductivity type. Disordered regions extend from the contact layer through to the first confinement layer defining diode laser cavities. Resistive regions are formed within the disordered regions. Individual contacts on the contact layer aligned with each diode laser cavity inject current through the diode laser cavity to the contact on the substrate causing emission of coherent light through the edge of the diode laser structure. Individual contacts on the contact layer aligned with resistive region inject current through the resistive region to the contact on the substrate causing generation of heat. The resistive region within the disordered region forms a heater strip and adjacent heater strips maintain the temperature within the diode laser cavity inbetween the adjacent disordered regions of the heater strips. The resistive can be replaced with a diffused region to provide a forward biased p-n junction to form the heater strip. The contacts for the laser cavity and the heater strips can be interdigitated.

16 Claims, 4 Drawing Sheets

THERMALLY STABILIZED DIODE LASER STRUCTURE

BACKGROUND OF THE INVENTION

This invention relates to a diode laser, and, more particularly, to a diode laser structure that has been thermally stabilized by passing currents through heater strips along the sides of the diode laser cavity.

Typical diode laser pixel times for high speed printers are in the order of 10 to 100 nanoseconds. When the laser is turned on, adiabatic heating of the diode laser cavity occurs due to the inefficiency of the conversion of electrical energy into emitted light. The heat dissipates over time periods on the order of 10 to 100 microseconds. This difference in time constants will cause the temperature of the typical diode laser cavity to vary with the pattern of the data being written. This effect gives rise to pattern dependent instability. For example, if the laser has been off for a period of several microseconds, and it is turned on for a single pixel time, the laser cavity will be at some temperature T, when it emits the light for that single pixel. If, however, the laser has been on continuously, or quasi-continuously, for a period of several hundred microseconds, is turned off for just a few pixels, and is then turned back on again, the laser cavity will be at a higher temperature, T+dT. dT can be on the order of 1 to 10 degrees Centigrade, depending on the efficiency and structure of the laser.

This change in the temperature of the laser cavity can change both the power emitted and the wavelength of the emission. These changes are detrimental to some applications of diode lasers. In particular, the instability in the wavelength of the emission may cause a focus shift and degradation of the image quality.

A technology known as distributed feedback lasers is currently being pursued to stabilize the wavelength of the emission, by using Bragg scattering to define the laser cavity, instead of mirrors. This technology, which is capable of reducing the wavelength shift, but not the change in power emitted, has resulted in relatively expensive diode lasers.

Typical prior art diode laser structures use a heat sink to remove heat from the diode laser structure during light emission. The heat sink temperature is maintained at a constant level by using a Peltier or thermo-electric cooler. Because of the thermal resistance between the diode laser cavity and the heat sink, this technique is not capable of maintaining the diode laser cavity at a constant transient temperature. The heat sink helps maintain an average temperature within the diode laser cavity. The laser pixel times for high speed printers occur too fast and over too short periods of time for the heat sink or Peltier or thermo-electric cooler to respond to, thus resulting in temperature fluctuations from pulse to pulse within the laser cavity.

It is an object of this invention to provide a novel means to stabilize the temperature of a diode laser cavity and thus to stabilize the power emitted and the wavelength of the light emission from that diode laser cavity.

It is another object of this invention to provide a means to stabilize the temperature of a diode laser cavity at the hotter, higher temperature at which the laser cavity is emitting light even when the diode laser cavity is not emitting light.

It is another object of this invention to provide a means to stabilize the temperature of a diode laser cavity at a constant transient temperature and to stabilize the temperature of a diode laser cavity from pulse to pulse.

SUMMARY OF THE INVENTION

In accordance with the present invention, a thermally stabilized diode laser structure comprises a first confinement layer and a substrate of one conductivity type, an active layer, a second confinement layer and a contact layer of an opposing conductivity type. Disordered regions extend from the contact layer through to the first confinement layer defining diode laser cavities. Resistive regions are formed within the disordered regions. Individual contacts on the contact layer aligned with each diode laser cavity inject current through the diode laser cavity to the contact on the substrate causing emission of coherent light through the edge of the diode laser structure. Individual contacts on the contact layer aligned with resistive region inject current through the resistive region to the contact on the substrate causing generation of heat. The resistive region within the disordered region forms a heater strip and adjacent heater strips maintain the temperature within the diode laser cavity located between the adjacent disordered regions.

The resistive region can be replaced with a diffused region of conductivity opposite to the disordered region to provide a forward biased p-n junction to form the heater strip. The contacts for the laser cavity and the heater strips can be interdigitated.

Other objects and attainments together with a fuller understanding of the invention will become apparent and appreciated by referring to the following description and claims taken in conjunction with the accompanying drawings.

DETAILED DESCRIPTION OF THE INVENTION

Figures 1, 2:
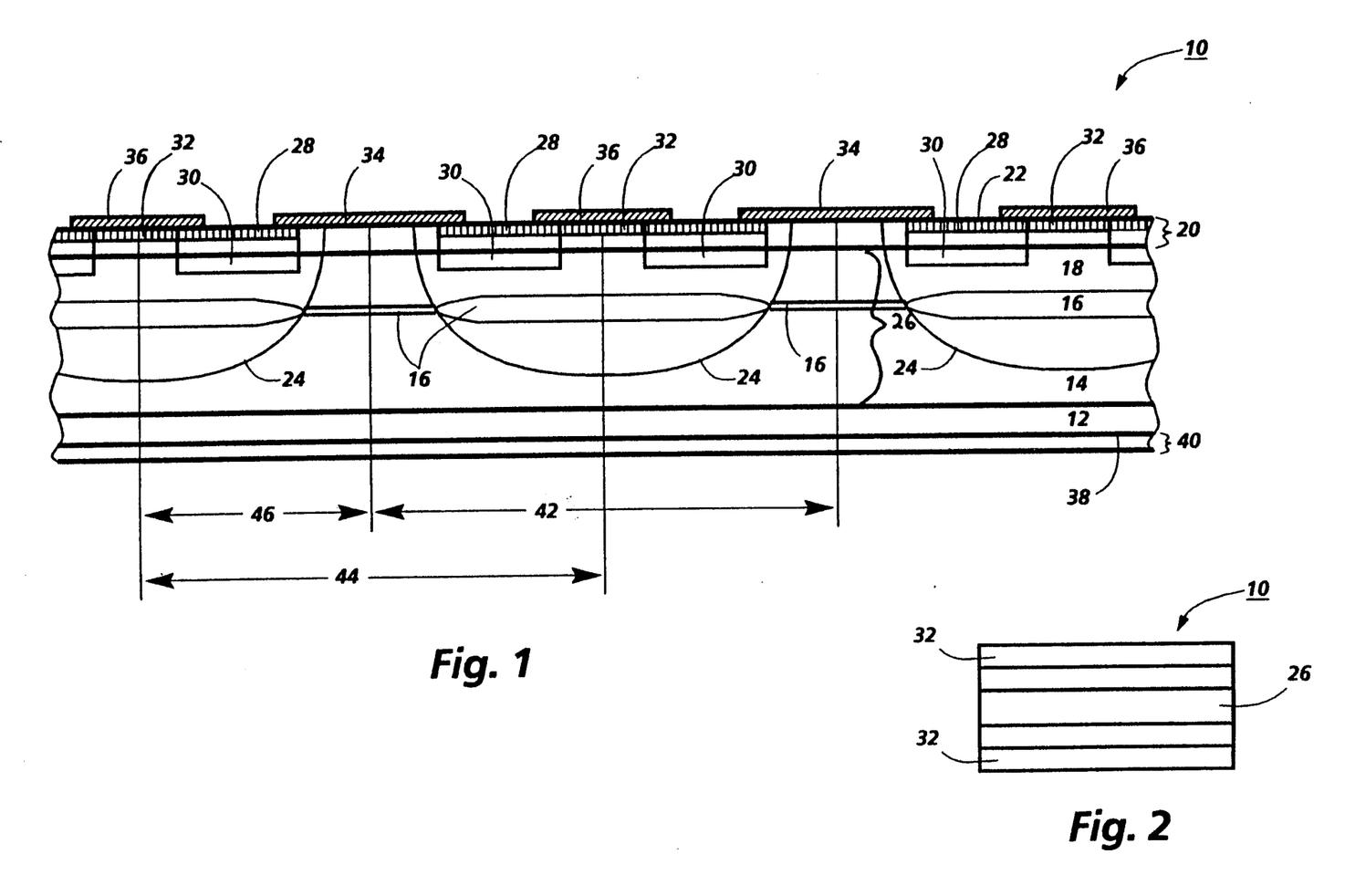
FIG. 1 is a schematic illustration of the side view of the thermally stabilized diode laser structure formed according to the present invention.
FIG. 2 is a schematic illustration of the top view of the thermally stabilized diode laser structure of FIG. 1 formed according to the present invention.

Reference is now made to FIG. 1, wherein there is illustrated a thermally stabilized diode laser structure 10 of this invention.

The thermally stabilized diode laser structure 10 comprises a substrate 12 of n-GaAs upon which is epitaxially deposited a first confinement layer 14 of n-$Al_xGa_{1-x}As$; an active layer 16 of nondoped GaAs for providing light wave generation and propagation under lasing conditions at a wavelength, a second confinement layer 18 of p-$Al_yGa_{1-y}As$ where x= or ≠y, and a contact layer 20 of p-GaAs.

The active layer 16 may, in the alternative, be nondoped or p-type doped or n-type doped; GaAs, $Al_zGa_{1-z}As$ or $(Al_zGa_{1-z})_{0.5}In_{0.5}P$; or a relatively thin conventional double heterostructure (DH) active layer; or a single quantum well, such as GaAs or $Al_zGa_{1-z}As$ where z is very small and z<x and y; or a multiple quantum well superlattice, such as alternating layers of GaAs and $Al_zGa_{1-z}As$ where z<x and y or alternating layers of $Al_wGa_{1-w}As$ and $Al_BGa_{1-B}As$ where w<B<x or y (w for well and B for barrier). Also, in the alternative, any of the aforementioned active layers can be deposited between two semiconductor confinement layers of $Al_mGa_{1-m}As$ and $Al_nGa_{1-n}As$, where m= or ≠n, but with the bandgaps intermediate between the bandgaps of the active layer and the first and second confinement layers, in a separate confinement structure.

As is known in the art, the epitaxial growth of thermally stabilized diode laser structure 10 may be carried out by molecular beam epitaxy (MBE) or metalorganic chemical vapor deposition (MOCVD). The substrate 12 may be about 100 microns thick. The confinement layers 14 and 18 may have a thickness in the range of 0.1 to 1 micron. The active layer 16 may be a thin conventional layer having a thickness of 50 nanometers to 2 microns or may be comprised of a superlattice structure of quantum wells which may be 3 to 50 nanometers thick. The contact layer 20 is typically 0.1 to 0.2 microns thick.

There are alternate conventional techniques and diffusion/implant species for carrying out the desired disordering or the elemental implant/annealing technique. Discussion hereafter will be confined to impurity induced disordering. However, it should be noted that these other techniques and elemental diffusions or implants are equally applicable.

Upon completion of the epitaxial growth, a $Si_3N_4$ mask is formed on the top surface 22 of the contact layer 20 of the semiconductor diode laser structure 10 with openings exposing regions of the semiconductor structure to impurity induced disordering. The mask protects the unexposed regions under which the laser cavities will be formed.

The laser cavities are established by first selectively diffusing a high concentration n-impurity dopant, such as silicon, into the regions of the semiconductor structure exposed through the mask. Other possible n-impurity dopant elements would include Ge and Sn.

A silicon layer is deposited in the opening in the $Si_3N_4$ mask and then capped with an additional layer of $Si_3N_4$. The diffusion of silicon is accomplished at a temperature of approximately 800° C. and is maintained for a sufficiently long period of time, e.g. seven to eight hours, to penetrate the contact layer 20, the second confinement layer 18 and the active layer 16, and partially penetrate the first confinement layer 14.

The diffusion of silicon through and into the active layer 16, the contact layer 20 and the confinement layers 14 and 18 causes an intermixing of Ga and Al in the active layer 16, the contact layer 20 and the confinement layers 14 and 18, thereby forming a n-impurity induced disordered region 24.

Between the disordered regions 24 in the structure 10 are the laser cavities 26 consisting of the nondisordered sections of the second confinement layer 18, the active layer 16 and the first confinement layer 14. The disordered regions, optically and electrically, isolate and separate the laser cavities. The laser cavities are formed by the confinement layers in the vertical direction and the disordered regions in the horizontal direction. The laser cavities extend longitudinally down the length of the semiconductor diode laser structure 10, as best shown in FIG. 2.

Upon completion of the impurity induced disordering steps, shallow resistive regions 28 are formed in the disordered regions 24 by implantation of He+ or O+ ions through the top surface 22. The resistive region is made by converting a portion of the top layer or layers of the semiconductor structure from conducting material to highly resistive material. This conversion can be accomplished by implanting He+ or O+ ions through the surface to form electronic states at energies in the bandgap of the semiconductor layers. These defect states remove electrons or holes from the doped layer thereby making it resistive.

The resistive region implantation can be made through the same mask openings as used for the silicon diffusion after the silicon diffusion has been performed and the openings have been reopened. It is also possible, but less desirable, to form the resistive region by depositing a resistive material on the surface of the contact layer. The resistive regions 28 extend longitudinally down the length of the semiconductor diode laser structure 10, parallel to the laser cavities 26, as best seen in FIG. 2.

Electrically isolating strips 30 are formed in the disordered regions 24 by proton (He+) or O+ ion implantation through the top surface 22 to isolate portions of the resistive regions 28 as heater strips 32. The electrically isolating strips 30 are formed by implanting the He+ or O+ ions deep into the disordered regions 24 through the resistive region 28. The electrically isolating strips 30 are formed adjacent to both sides of the laser cavities 26 by masking a central portion of the resistive region against the deep implant. The electrically isolating regions 30 are formed adjacent and on both sides of the resistive region 28. After this implant, the strips 30 provide electrical isolation between the laser and heater contacts which will be formed on the top surface 22 of the contact layer 20.

The technique for forming the resistive region is the same as that used conventionally to form the electrically isolating region in a diode laser by proton (He+) bombardment. The difference is that the depth and dosage of the resistive region implant is controlled to produce a specific resistivity which is less than the resistivity of an implant done for electrical isolation. Typically the resistive region implant will have a few kohms of resistance while the isolation implant will have many megohms of resistance or more. Thus, the resistive region implant will be shallower and/or have a lower dosage of ions at a lower energy than the isolating region implant.

Standard masking means or other techniques are employed to form metal contacts of Cr-Au or Ti-Pt-Au on the top surface 22 of the contact layer 20. These metal contacts are used as laser contacts or heater contacts.

Laser contacts 34 are aligned with each laser cavity 26. The laser contacts extend on the top surface 22 across the nondisordered section of the contact layer 20 and across the adjacent disordered regions 24 on both sides of the nondisordered section and partially extend across the adjacent electrically isolating region 30 on both sides. Each laser contact separately, independently, and individually contacts a laser cavity.

Heater contacts 36 are aligned with each heater strip 32. The heater contacts extend on the top surface 22 across the heater strip 32 and partially extends across the adjacent electrically isolating region 30 on both sides. Each heater contact separately, independently, and individually contacts a heater strip.

The electrically isolating regions 30 have laser contacts 34 and heater contacts 36 partially extending along their top surface 22 but the laser contacts and heater contacts are electrically and physically isolated from each other.

The laser and heater contacts are typically rectangular in shape for ease in forming high density arrays and extend longitudinally down the length of the semiconductor diode laser structure 10, parallel to the laser cavities 26, parallel to the heater strips 32 and parallel to each other. Each contact, either laser or heater, is shaped by shaping the hole in a metallization mask. Both contacts can be formed simultaneously in one evaporation.

The nondisordered contact layer 20 beneath each laser contact 34 provides low electrical resistance to the aligned laser cavity 26. The heater contact 36 is directly attached to the heater strip 32 to allow current to be directly passed through the heater.

The bottom surface 38 of the substrate 12 is also metallized with Au/Ge to form a substrate contact 40. The substrate contact is for both heater and laser contacts and can be referenced to ground.

Current is injected between the laser contact 34 and the substrate contact 40 in the laser cavity 26 to forward-bias the p-n junction of the second confinement layer layer 18 and the first confinement layer 14 to cause the active layer 16 to emit a coherent laser beam. The nondisordered second confinement layer of p-Al$_y$Ga$_{1-y}$As is the p-confinement layer and the nondisordered first confinement layer of n-Al$_x$Ga$_{1-x}$As is the n-confinement layer of the p-n junction.

The current is injected through the laser contact 34, the nondisordered section of the contact layer 20, the nondisordered section of the second confinement layer 18, the nondisordered section of the active layer 16 of the individual laser diode, and then spreads in the nondisordered section of the first confinement layer 14 into the substrate 12 and out the substrate contact 40.

The substrate or ground contact is common to all the laser diodes. However, each laser cavity contains a p-n junction that is separately biased through its laser contact from all the others. Since each laser contact is positively biased with respect to ground, current flows only from each laser contact to ground. The electrically isolating regions and the disordered regions prevents any single laser contact from causing adjacent laser cavities to emit light or from causing adjacent heater strips to generate heat. Flow between different laser contacts does not occur because any small potential difference between the addressed laser contact and a neighboring laser contact corresponds to a reverse voltage on the neighboring laser contact.

The light is emitted through the edge of the semiconductor diode laser structure 10 and can be either continuous wave or pulse.

Typically, the laser diode semiconductor structure 10 has an operating current of about 12 milliamperes with an output power of about 5 milliwatts per individual laser cavity 26.

Current is injected between the heater contact 36 and the substrate contact 40 to cause the heater strip 32 to generate heat. The heat generated will equal the voltage times the current or, alternatively, the heat generated will equal the current squared times the resistance of the heater strip.

The current is injected through the heater contact 36, the heater strip 32, the n-disordered region 24, and then spreads in the first confinement layer 14 into the substrate 12 and out the substrate contact 40. The substrate or ground contact is common to all the heater strips.

Since each heater contact is positively biased with respect to ground, current flows only from each heater contact to ground. The electrically isolating regions and the disordered regions prevents any single heater contact from causing adjacent heater strips to generate heat or from causing adjacent laser cavities to emit light.

In FIG. 1, adjacent laser cavities 26 are spaced symmetrically apart with a spacing 42 of 10 microns. Adjacent heater strips 32 are spaced symmetrically apart with a spacing 44 of 10 microns. Adjacent laser cavity and heater strips are spaced symmetrically apart with a spacing 46 of 5 microns.

The symmetrical spacing of the adjacent heater strips 32 on both sides of the laser cavity 26 provides heating on both sides of each laser cavity. The resistive region 28 of the heater strip 32 have some finite electrical resistance. Heat will thus be generated when a current is run through the heater strip.

Thus, when current is injected through the heater strips 32, heat is generated and spreads out through the n-disordered regions 24. Since the heater contacts 36 will only be addressed in adjacent pairs, adjacent heater strips 32 will heat the laser cavity 26, which will emit the coherent light beam.

This technique can be used on lasers which are widely spaced apart or more tightly spaced one micron width stripe lasers with one micron width disordered regions yielding spacings of less than five microns.

As shown in FIG. 2, two adjacent heater strips 32 have been fabricated along the sides of the laser cavity 26 of the thermally stabilized diode laser structure 10. As with the resistive regions and the n-disordered regions, the heater strips 32 extend longitudinally down the length of the semiconductor diode laser structure 10, parallel to the laser cavities 26.

When the current is run through the laser cavity to emit light (the laser diode is on), the current in the adjacent heater strips is reduced to zero. When the current to the laser cavity is reduced to zero (the laser diode is off), a current is run through the adjacent heater strips. The amount of current run through the adjacent heater strips, when no current is run through the laser cavity, is set to be precisely the amount needed to generate sufficient heat to maintain the temperature within the laser cavity at the same value as it was during emission of light. The temperature will remain constant within the laser cavity, regardless of how long or short a time the diode laser is on or how long or short a time the diode laser is off. Thus, the laser cavity is held at constant temperature, and the power emitted and wavelength of the emission from the laser cavity remain constant independent of the data.

To maintain the temperature of the active region during a pixel time when the current to the laser cavity is reduced to zero (the laser diode is off), the adjacent heater strips need supply only enough energy to replace the heat lost from the laser cavity. The temperature of the laser cavity will drop on the order of 1 degree Centigrade for a pixel time of 100 nanoseconds. To increase the temperature of the laser cavity by 1 degree Centigrade, the two half cylinders of semiconductor material adjacent to the laser cavity must be heated.

The half cylinder used in the calculation is centered on one heater strip. This strip heats half of the two adjacent laser cavities, so for multiple laser structures we get the benefit of heat flow in both directions. For single laser structures or for the end laser, half the heat from each cylinder is wasted. The calculation is for each half cylinder.

For the dimensions of FIGS. 1 and 2 and a thermally stabilized diode laser structure length of 250 microns, the volume of the material to be heated by each heater strips is $9.8 \times 10^{-9}$ cm$^3$. (The spacing of the lasers is taken to be 10 microns. 5 microns is then the radius of the cylinder centered on the heater strip and extended to the center of adjacent laser cavities. The volume of the half cylinder is $\pi \times R^2 \times 250$ microns /2.)

For GaAs/AlGaAs with a specific heat of 0.07636 cal/gm-deg and a density of 3.6 gm/cm$^3$, a one degree Centigrade temperature rise in 100 nanoseconds requires 113 milliwatts (mW). This input power can be supplied by 10 milliamperes (mA) of current to a 1.13 thousand ohm (kohm) resistor in the heater strip or by 100 milliamperes (mA) of current to an 11.3 ohm resistor in the heater strip. Both values are reasonable levels to obtain from a heater strip.

Figure 3:
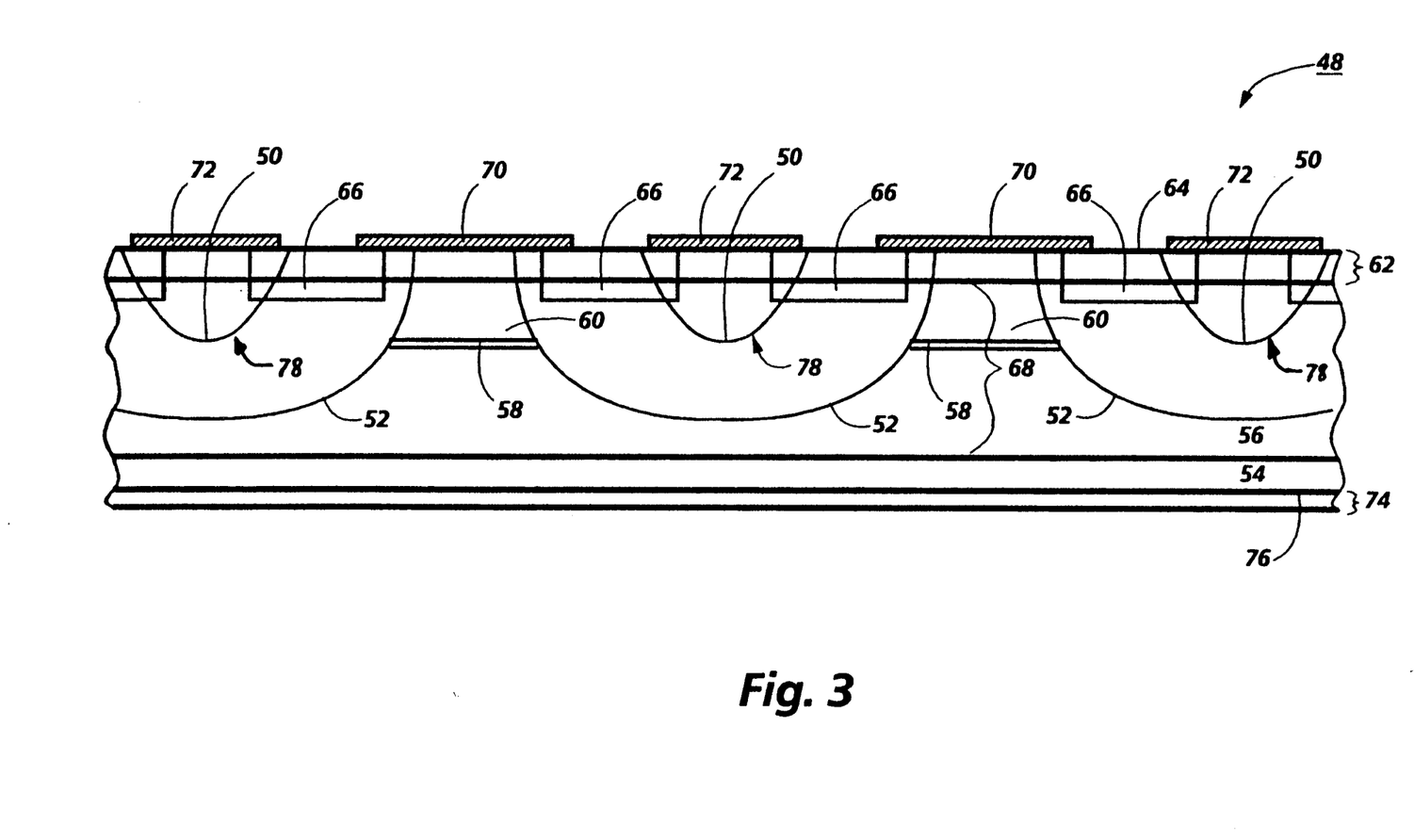
FIG. 3 is a schematic illustration of the side view of an alternative embodiment of the thermally stabilized diode laser structure formed according to the present invention.

In FIG. 3, the thermally stabilized diode laser structure 48 is of identical structure to the thermally stabilized diode laser structure 10 of FIG. 1, except that the resistive region 28 of FIG. 1 has been replaced with a diffused region 50 in FIG. 3 to form a p-n junction with the disordered region 52. Thus, the thermally stabilized laser diode structure 48 comprises a substrate 54 of n-GaAs upon which is epitaxially deposited a first confinement layer 56 of n-Al$_x$Ga$_{1-x}$As; an active layer 58 of nondoped GaAs for providing light wave generation and propagation under lasing conditions, a second confinement layer 60 of p-Al$_y$Ga$_{1-y}$As where x=or x$\neq$ y, and a contact layer 62 of p-GaAs.

N-impurity induced disordered regions 52 are formed in the thermally stabilized diode laser structure 48 extending through portions of the contact layer 62, the second confinement layer 60, the active layer 58 and partially extending through the first confinement layer 56.

Upon completion of the n-impurity induced disordering step, a second Si$_3$N$_4$ mask is formed on the top surface 64 of the contact layer 62 with openings exposing regions of the laser structure to diffusion of impurity atoms into the semiconductor layers. This second mask exposes a narrower, centered region of the n-impurity induced disordered regions 52, symmetrically spaced from the nondisordered regions of the contact layer 62.

A high concentration p-impurity dopant, such as zinc, will be selectively diffused into the regions of the laser structure exposed by the second mask. The diffusion of zinc is accomplished at a relatively low temperature of approximately 650° C. in an evacuated heater, such as a semi-sealed graphite boat, containing appropriate diffusion and arsenic sources and is maintained for a sufficiently long period of time, e.g. approximately one hour, to partially penetrate the n-impurity induced disordered region 52 to form the p-diffused region 50 for a one micron deep diffusion. The p-diffused regions 50 are symmetrically centered and entirely within the n-disordered regions 52.

Other p-impurity dopants such as Be and Mg do not diffuse as fast as zinc through various layers. This may be an advantage allowing for better control of the depth to which the p-impurity dopant will diffuse down The diffusion step can occur near completion of the disordering step is complete in order to avoid additional disordering during p diffusion. The diffusion step is only type conversion of the disordered region from n to p.

Electrical isolating regions 66 are formed in the n-disordered regions 52 through the top surface 64, adjacent to the p-disordered regions 50.

Between the n-disordered regions 52 in the thermally stabilized diode laser structure 48 are the laser cavities 68 consisting of the nondisordered sections of the second confinement layer 60, the active layer 58 and the first confinement layer 56.

Laser contacts 70 are formed on the top surface 64, aligned with each diode laser cavity 68. Heater contacts 72 are formed on the top surface of the p-diffused region 50, aligned with each p-diffused region. The electrically isolating regions 66 electrically and physically isolate the adjacent laser and heater contacts. A substrate contact 74 is formed on the bottom surface 76 of the substrate 54.

Current is injected between the laser contact 70 and the substrate contact 74 in the laser cavity 68 to forward-bias the p-n junction of the second confinement layer layer 60 and the first confinement layer 56 to cause the active layer 58 to emit a coherent laser beam. The nondisordered second confinement layer of p-Al$_y$Ga$_{1-y}$As is the p-confinement layer and the nondisordered first confinement layer of n-Al$_x$Ga$_{1-x}$As is the n-confinement layer of the p-n junction.

The current is injected through the laser contact 70, the nondisordered section of the contact layer 62, the nondisordered section of the second confinement layer 60, the nondisordered section of the active layer 58 of the individual diode laser, and then spreads in the nondisordered section of the first confinement layer 56 into the substrate 54 and out the substrate contact 74. The substrate or ground contact is common to all the laser cavities.

Current is injected between the heater contact 72 and the substrate contact 74 to forward-bias the p-n junction of the second disordered region 50 and the first disordered region 52 to generate heat. The p-n junction between the p-diffused region 50 and the n-disordered region 52 constitute a heater strip 78.

The current is injected through the heater contact 72, the p-diffused region 50, the n-disordered region 52, and then spreads in the first confinement layer 56 into the substrate 54 and out the substrate contact 74. The substrate or ground contact is common to all the heater strips.

As with the thermally stabilized diode laser structure 10 of FIGS. 1 and 2, the adjacent laser cavities 68 are symmetrically spaced apart, the adjacent heater strips 78 are symmetrically spaced apart, and adjacent laser cavity and pair of heater strips are symmetrically spaced apart in the thermally stabilized diode laser structure 48 of FIG. 3.

The symmetrical spacing of the adjacent heater strips 78 on both sides of the laser cavity 68 provides heating on both sides of each laser cavity. Similar to FIG. 2, the heater strips 78 extend longitudinally down the length of the semiconductor diode laser structure 48, parallel to the laser cavities 68. When current is injected through the p-n junction of the heater strips, heat is generated and spreads through the n-disordered regions 52. Since the heater contacts 72 will only be addressed in adjacent pairs, adjacent heater strips 78 will heat the nondisordered active layer 58, between the heater strips, which will emit the coherent light beam.

When the current is run through the laser cavity to emit light (the diode laser is on), the current in the adjacent heater strips is reduced to zero. When the current to the laser cavity is reduced to zero (the diode laser is off), a current is run through the adjacent heater strips. The amount of current run through the adjacent heater strips, when no current is run through the laser cavity, is set to be precisely the amount needed to generate sufficient heat to maintain constant temperature within the laser cavity. Thus, the laser cavity is held at constant temperature, and the power emitted and wavelength of the emission remain constant independent of the data.

To maintain the temperature of the active region during a pixel time when the current to the laser cavity current is reduced to zero (the diode laser is off), the adjacent heater strips need supply only enough energy to replace the heat lost from the laser cavity. The temperature will drop on the order of 1 degree Centigrade for a pixel time of 100 nanoseconds. To increase the temperature of the semiconductor material by 1 degree Centigrade, the two half cylinders of semiconductor material adjacent to the laser cavity must be heated. The heat generated by each p-n junction is given by its current times (the voltage on junction plus its internal series resistance). For the same conditions as in the thermally stabilized diode laser structure 10 in FIGS. 1 and 2, the p-n junction of the thermally stabilized diode laser structure 48 of FIG. 3 with voltage of 1.8 volts in series with a 10 ohm internal resistance will compensate for a 1 degree Centigrade temperature fluctuation with 49 milliamperes (mA) of current.

For the GaAs/AlGaAs semiconductor structure of this thermally stabilized diode lasers, the resulting p-n junction is formed in AlGaAs with Al composition high enough to make it indirect. The indirect material is especially advantageous in this case because virtually all the current passed through this junction generates heat. Indirect means the band to band transitions occur only nonradiatively, i.e. no light is emitted spontaneously. Therefore all electrons and holes recombine by giving up their energy in the form of heat without radiating light.

To reduce the time delay between the onset of the heater strip current and warming of the active region of the laser cavity, the source of the heat should be as close to the active region as possible. This also minimizes the amount of semiconductor material that must be kept warm. Thus, the p-n junction is advantageous compared to the resistive region since the junction, where the heat is generated is below the surface and therefore closer to the laser cavities.

Figure 4:
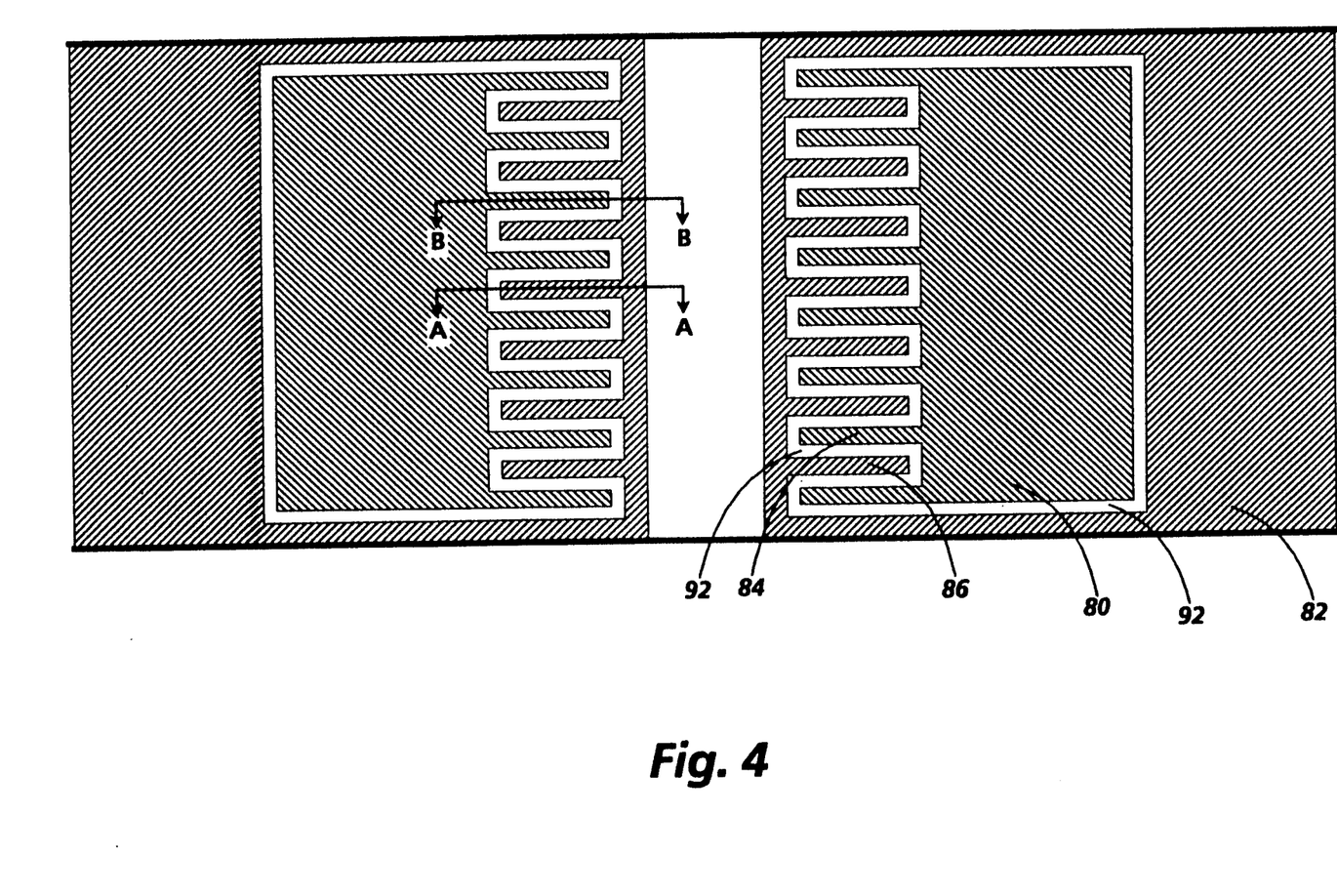
FIG. 4 is a schematic illustration of the top view of another alternate embodiment of the thermally stabilized diode laser structure formed according to the present invention.

The heater contact 80 and the laser contact 82 are interleaved with heater contact fingers 84 alternating with laser contact fingers 86 on the top surface 88 of the thermally stabilized diode laser structure 90 of FIG. 4.

The interleaving of heater and laser contact fingers is also referred to as interdigitated contacts. The heater contact fingers 84 extend outward from the heater contact 80. The laser contact 82 surrounds the heater contact 80 with the laser contact fingers 86 extending inward from the laser contact to interleave with the heater contact fingers 84. Electrically isolating regions 92 electrically and physically isolate the heater contacts 80 and the laser contacts 82 from each other.

Figure 4A:
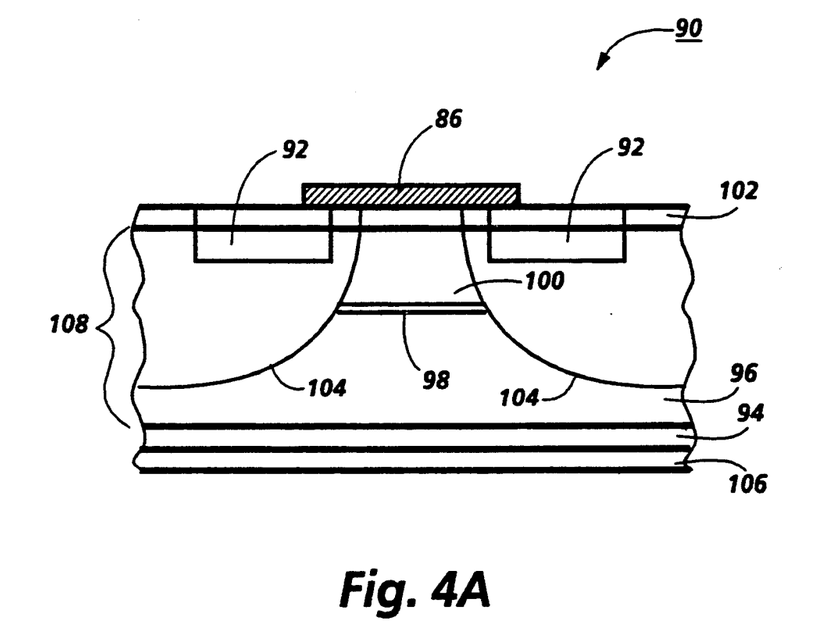
FIG. 4A is a schematic illustration of the side view through line A—A of the thermally stabilized diode laser structure of FIG. 4 formed according to the present invention.

FIG. 4A is a side sectional view along line A—A across the laser contact finger 86 of the thermally stabilized diode laser structure 90 of FIG. 4.

The thermally stabilized diode laser structure 90 of FIG. 4A is of identical structure to the thermally stabilized diode laser structure 10 of FIG. 1, except the resistive layer 28 and resulting heater strip 32 of FIG. 1 is not implanted and formed in this section of the thermally stabilized diode laser structure 90 underneath the laser contact 84. Thus, the thermally stabilized laser diode structure 90 comprises a substrate 94 of n-GaAs, a first confinement layer 96 of n-Al$_x$Ga$_{1-x}$As; an active layer 98 of nondoped GaAs for providing light wave generation and propagaion under lasing conditions, a second confinement layer 100 of p-Al$_y$Ga$_{1-y}$As where x = or x≠ y, a contact layer 102 of p-GaAs, n-impurity disordered regions 104, electrically isolating regions 92, laser contact finger 86 of the laser contact 82, substrate contact 106, and laser cavity 108, formed as previously stated in the present application.

The n-impurity induced disordered regions 104 extend through portions of the contact layer 102, the second confinement layer 100, the active layer 98 and partially extending through the first confinement layer 96. Between the n-disordered regions 104 are the laser cavities 108 consisting of the nondisordered sections of the second confinement layer 100, the active layer 98 and the first confinement layer 96. The electrical isolating regions 92 are formed in the n-disordered regions 104 through the top surface, adjacent to the non-disordered contact layer 102 with the laser contact 82 extending across the non-disordered contact layer 102 between the adjacent electrically isolating regions 92.

Current is injected between the laser contact 82 and the substrate contact 106 in the laser cavity 108 to forward-bias the p-n junction of the second confinement layer layer 100 and the first confinement layer 96 to cause the active layer 98 to emit a coherent laser beam. The current is injected through the laser contact 82, the nondisordered section of the contact layer 102, the nondisordered section of the second confinement layer 100, the nondisordered section of the active layer 98 of the individual laser diode, and then spreads in the nondisordered section of the first confinement layer 96 into the substrate 94 and out the substrate contact 106. The substrate or ground contact is common to all the laser cavities.

Figure 4B:
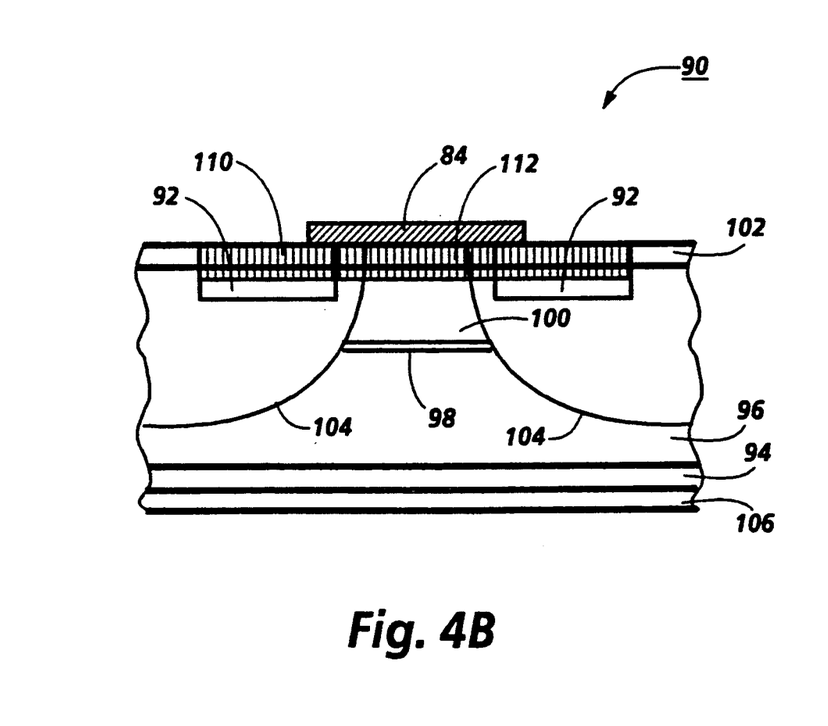
FIG. 4B is a schematic illustration of the side view through line B—B of the thermally stabilized diode laser structure of FIG. 4 formed according to the present invention.

FIG. 4B is a side sectional view along line B—B across the heater contact finger 84 of the thermally stabilized diode laser structure 90 of FIG. 4. The thermally stabilized diode laser structure 90 of FIG. 4B is of identical structure to the thermally stabilized diode laser structure 10 of FIG. 1, except the n-impurity induced disordered regions 104 are formed adjacent to the resistive layer 110 in FIG. 4B with the resulting heater strip 112 aligned with the laser cavity 108 as opposed to FIG. 1 where the resistive layer 28 is implanted in the n-disordered region 24 so that the heater strips 32 are not aligned with the laser cavity.

Thus, the thermally stabilized laser diode structure 90 of FIG. 4B comprises a substrate 94 of n-GaAs, a first confinement layer 96 of n-$Al_xGa_{1-x}As$; an active layer 98 of nondoped GaAs for providing light wave generation and propagaion under lasing conditions, a second confinement layer 100 of p-$Al_yGa_{1-y}As$ where x=or x≠ y, a contact layer 102 of p-GaAs, a resistive layer 110, n-impurity disordered regions 104, a heater strip 112, electrically isolating regions 92, heater contact finger 84 of the heater contact 80, and substrate contact 106, formed as previously stated in the present application.

The n-impurity induced disordered regions 104 extend through portions of the contact layer 102, the second confinement layer 100, the active layer 98 and partially extending through the first confinement layer 96. The resistive layer 110 is implanted through the nondisordered section of the contact layer 102 and partially through the nondisordered section of the second confinement layer 100 between and partially extending into the adjacent n-impurity disordered regions 104. The electrically isolating regions 92 are implanted at the ends of the resistive layer into the adjacent n-impurity disordered regions 104 forming the heater strip 112 between the adjacent electrically isolating regions 92.

Current is injected between the heater contact 80 and the substrate contact 106 to cause the heater strip 112 to generate heat. The current is injected through the heater contact 80, the heater strip 112, the nondisordered section of the second confinement layer 100, the nondisordered section of the active layer 98, and then spreads in the first confinement layer 100 into the substrate 94 and out the substrate contact 106. The substrate or ground contact is common to all the heater strips.

The laser cavity 108 is underneath and extends longitudinally perpendicular to the heater contact fingers 84 and the laser contact fingers 86 in FIG. 4. The heater strips underneath the heater contact fingers are intermittent at regular intervals along the length of the laser cavity, as shown by the interdigitated pattern of the laser and heater contacts.

The heater strip 112 of FIG. 4B is aligned with the nondisordered second confinement layer 100, the nondisordered active layer 98 and the nondisordered first confinement layer 96 which are the laser cavity 108 of FIG. 4A. The heater strip in the thermally stabilized diode laser structure 90 of FIG. 4 is on the order of 1.5 microns from the active region rather than the 5 microns used in the thermally stabilized diode laser structures of FIGS. 1 and 3.

Under the fingers of the heater contact, the high resistivity regions of the heater strips are implanted while under the fingers of the laser contacts are the low resistance of the sections of the nondisordered contact layers. If the contact fingers are narrow enough, the carrier density will be uniform in the active region due to current spreading in the cladding and carrier diffusion in the active layer. The laser cavity extends longitudinally perpendicular to the heater contact fingers 84 and the laser contact fingers 86. Current through the laser contact fingers will pass through the entire laser cavity to generate light wave under lasing conditions along its entire longitudinal length, even the sections of the first and second confinement layers and active layers aligned underneath the heater contact fingers. Similarly, current through the heater contact fingers will pass through the heater strips and generate heat along the entire longitudinal length of the laser cavity, even the sections of the laser cavity not aligned underneath the heater contact fingers.

The heater strip current does pass through the active layer of both the heater and laser sections of the laser cavity. Howver, the heater strip current generates heat because of resistance in the heater strips but does not cause lasing from the active layer of the laser cavity because the heater strip current is too low.

The heater strips 112 of FIG. 4 are aligned directed with the laser cavities 108. Therefore, heat generation is symmetric and only one heater strip is needed, as contrasted with the adjacent pairs of heater strips in FIGS. 1 and 3. As discussed previously with regard to the thermally stabilized diode laser structures of FIGS. 1 and 3, in the thermally stabilized laser diode structure 90 of FIG. 4, when the current is run through the laser cavity 108 to emit light (the laser diode is on), the current in the adjacent heater strip 112 is reduced to zero. When the current to the laser cavity 108 is reduced to zero (the laser diode is off), a current is run through the adjacent heater strip 112.

The laser cavity of a diode laser structure has a threshold or minimum operating temperature for light wave generation and propagation under lasing conditions which must be generated within the laser cavity. A heater strip or adjacent heater strips cannot be used to reach the threshold operating temperature. However, once past that minimum temperature, the heater strip can be used to maintain the temperature of the laser cavity of a diode laser structure at the transient times or within a pulse fluctuations in temperature.

Once above the threshold operating temperatures, the laser cavity of a thermally stabilized laser structure may be cooled by the emission of light. This heat loss may be balanced by the heat produced from the adjacent heater strips. Thus, current may be injected through the heater strips, even when current is being injected through the laser cavity, to produce the minimal amount of heat from the heater strips to offset the heat loss from emission of light from the laser cavity. Cooling occurs only if laser is heated above its operating temperature at the operating power.

The thermal stabilization of the diode laser structure is not restricted to the embodiments discussed but would include such diode laser structures as rib lasers, buried crescent lasers, gain-guided laser structures, buried heterostructure lasers, for example.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A thermally stabilized diode laser structure comprising:
   a first semiconductor confinement layer deposited on a substrate, said first confinement layer and said substrate having the same conductivity type,
   an active semiconductor layer deposited on said first confinement layer, said active layer providing light wave generation and propagation under lasing conditions,
   a second semiconductor confinement layer deposited on said active layer, said second confinement layer having an opposing conductivity type to said first confinement layer and said substrate, a semiconductor contact layer deposited on said second confinement layer, said contact layer having the same conductivity type as said second confinement layer, at least two disordered regions extending through said second confinement layer, said active layer and at least partially through said first confinement layer, said disordered regions having an opposing conductivity type to said second confinement layer, a resistive region formed in each of said disordered regions, at least one diode laser cavity formed between adjacent said disordered regions, at least one contact formed on said contact layer aligned with each of said at least one diode laser cavity, at least one contact formed on each of said resistive regions, and at least one contact formed on said substrate, such that current injected between said at least one contact aligned with said diode laser cavity and said at least one substrate contact will cause light emission from said diode laser cavity, such that current injected between said at least one contact aligned with said resistive region and said substrate contact will cause heat generation from said resistive region, and such that heat generated from adjacent resistive regions on adjacent disordered regions is used to maintain a constant temperature within said diode laser cavity formed between said adjacent disordered regions.

2. The thermally stabilized diode laser structure of claim 1 wherein said substrate, said first confinement layer and said disordered regions have n-type conductivity and said second confinement layer and said contact layer have p-type conductivity.

3. The thermally stabilized diode laser structure of claim 1 wherein two electrically isolating regions are formed in each of said disordered regions, each of said two electrically isolating regions being adjacent and to one side of said resistive region between said resistive region and an adjacent diode laser cavity.

4. The thermally stabilized diode laser structure of claim 1 wherein said at least one diode laser cavity comprises the nondisordered second confinement layer, the nondisordered active layer and the nondisordered first confinement layer between adjacent said disordered regions.

5. A thermally stabilized diode laser structure comprising:

a first semiconductor confinement layer deposited on a substrate, said first confinement layer and said substrate having the same conductivity type, an active semiconductor layer deposited on said first confinement layer, said active layer providing light wave generation and propagation under lasing conditions, a second semiconductor confinement layer deposited on said active layer, said second confinement layer having an opposing conductivity type to said first confinement layer and said substrate, a semiconductor contact layer deposited on said second confinement layer, said contact layer having the same conductivity type as said second confinement layer, disordered regions extending through said second confinement layer, said active layer and at least partially through said first confinement layer, said first disordered regions having an opposing conductivity type to said second confinement layer, a diffused region formed in each of said disordered regions, said diffused region having an opposing conductivity type to said first disordered region, said diffused region and said disordered region forming a p-n junction, at least one diode laser cavity formed between adjacent said first disordered regions, at least one contact formed on said contact layer aligned with each of said diode laser cavities, at least one contact formed on each of said diffused regions, and at least one contact formed on said substrate, such that current injected between said at least one contact aligned with said diode laser cavity and said at least one substrate contact will cause light emission from said diode laser cavity, such that current injected between said at least one contact aligned with said diffused region and said substrate contact will cause heat generation from said p-n junction, and such that heat generated from adjacent p-n junctions on adjacent disordered regions is used to maintain a constant temperature within said diode laser cavity formed between said adjacent first disordered regions.

6. The thermally stabilized diode laser structure of claim 5 wherein said substrate, said first confinement layer and said disordered regions have n-type conductivity and said second confinement layer, said contact layer, and said diffused regions have p-type conductivity.

7. The thermally stabilized diode laser structure of claim 5 wherein two electrically isolating regions are formed in each of said disordered regions, each of said two electrically isolating regions being adjacent and to one side of said diffused region between said diffused region and an adjacent at least one diode laser cavity.

8. The thermally stabilized diode laser structure of claim 5 wherein said at least one diode laser cavity comprises the nondisordered second confinement layer, the nondisordered active layer and the nondisordered first confinement layer between adjacent said disordered regions.

9. A thermally stabilized diode laser structure comprising:

a first semiconductor confinement layer deposited on a substrate, said first confinement layer and said substrate having the same conductivity type, an active semiconductor layer deposited on said first confinement layer, said active layer providing light wave generation and propagation under lasing conditions, a second semiconductor confinement layer deposited on said active layer, said second confinement layer having an opposing conductivity type to said first confinement layer and said substrate, a semiconductor contact layer deposited on said second confinement layer, said contact layer having the same conductivity type as said second confinement layer, at least two diordered regions extending through said second confinement layer, said active layer and at least partially through said first confinement layer, said disordered regions having an opposing conductivity type to said second confinement layer, at least one diode laser cavity formed between adjacent said disordered regions, a resistive region formed intermittently through said contact layer, said resistive region aligned with said at least one diode laser cavity, said resistive region being between adjacent said disordered regions, at least one contact formed on said contact layer aligned with each of said at least one diode laser cavity where said resistive region has not been formed, at least one contact formed on each of said resistive regions, and at least one contact formed on said substrate, such that current injected between said at least one contact aligned with said diode laser cavity and said at least one substrate contact will cause light emission from said diode laser cavity, such that current injected between said at least one contact aligned with said resistive region and said substrate contact will cause heat generation from said resistive region, and such that heat generated from said resistive region on said diode laser cavity is used to maintain a constant temperature within said diode laser cavity formed between said adjacent disordered regions.

10. The thermally stabilized diode laser structure of claim 9 wherein said substrate, said first confinement layer and said disordered regions have n-type conductivity and said second confinement layer and said contact layer have p-type conductivity.

11. The thermally stabilized diode laser structure of claim 9 wherein two electrically isolating regions are formed in each of said disordered regions, each of said two electrically isolating regions being adjacent and to one side of said resistive region.

12. The thermally stabilized diode laser structure of claim 9 wherein said at least one diode laser cavity comprises the nondisordered second confinement layer, the nondisordered active layer and the nondisordered first confinement layer between adjacent said disordered regions.

13. The thermally stabilized diode laser structure of claim 9 wherein said at least one contact aligned with said diode laser cavity and said at least one contact aligned with said resistive region form an interdigitated pattern.

14. A method of thermally stabilizing a diode laser structure comprising the steps of:

emission of light under lasing conditions from a diode laser cavity of said diode laser structure, and generation of heat from current injected through a resistive region of said diode laser structure, such that heat generated from adjacent resistive regions is used to maintain a constant temperature within said diode laser cavity.

15. A method of thermally stabilizing a diode laser structure comprising the steps of:

emission of light under lasing conditions from a diode laser cavity of said diode laser structure, and generation of heat from current injected through a p-n junction of said diode laser structure, such that heat generated from adjacent p-n junctions is used to maintain a constant temperature within said diode laser cavity.

16. A method of thermally stabilizing a diode laser structure comprising the steps of:

emission of light under lasing conditions from a diode laser cavity of said diode laser structure, and generation of heat from current injected through a resistive region of said diode laser structure, such that heat generated from said resistive region on said diode laser cavity is used to maintain a constant temperature within said diode laser cavity.

* * * * *